(12) United States Patent
Lian

(10) Patent No.: US 11,716,799 B2
(45) Date of Patent: Aug. 1, 2023

(54) DISPLAY DEVICE

(71) Applicant: AU Optronics Corporation, Hsin-Chu (TW)

(72) Inventor: Shiang-Lin Lian, Hsin-Chu (TW)

(73) Assignee: AU OPTRONICS CORPORATION, Hsin-Chu (TW)

(*) Notice: Subject to any disclaimer, the term of this patent is extended or adjusted under 35 U.S.C. 154(b) by 0 days.

(21) Appl. No.: 17/517,704

(22) Filed: Nov. 3, 2021

(65) Prior Publication Data

US 2023/0050331 A1    Feb. 16, 2023

(30) Foreign Application Priority Data

Aug. 11, 2021  (TW) .................................. 110129655

(51) Int. Cl.
| | |
|---|---|
| *G09G 3/32* | (2016.01) |
| *H05B 45/30* | (2020.01) |
| *H05B 45/10* | (2020.01) |
| *H01L 25/16* | (2023.01) |

(52) U.S. Cl.
CPC ........... *H05B 45/30* (2020.01); *H01L 25/167* (2013.01); *H05B 45/10* (2020.01)

(58) Field of Classification Search
CPC .......... H05B 45/10; H05B 45/30; G09G 3/32; G09G 3/20; G09G 2310/0243; G09G 3/3233; H01L 25/167
See application file for complete search history.

(56) References Cited

U.S. PATENT DOCUMENTS

| | | | |
|---|---|---|---|
| 2017/0199616 A1* | 7/2017 | Kim | ....................... G06F 3/0412 |
| 2018/0089491 A1* | 3/2018 | Kim | ....................... G06F 3/0412 |
| 2018/0174520 A1* | 6/2018 | Park | ..................... G09G 3/3258 |

FOREIGN PATENT DOCUMENTS

| | | |
|---|---|---|
| CN | 104575366 A | 4/2015 |
| TW | 202027060 A | 7/2020 |

* cited by examiner

*Primary Examiner* — Thai Pham
(74) *Attorney, Agent, or Firm* — WPAT, PC

(57) ABSTRACT

The present disclosure discloses a display device, including a glass substrate and a plurality of light emitting diodes (LEDs). The glass substrate includes a first side and a second side. The LEDs include a first LED and a second LED. Compared with a reference anode signal, a first anode signal received by the first LED has a first anode signal difference and a second anode signal received by the second LED has a second anode signal difference. The first anode signal difference is smaller than the second anode signal difference. Compared with a reference cathode signal, a first cathode signal received by the first LED has a first cathode signal difference and a second cathode signal received by the second LED has a second cathode signal difference. The first cathode signal difference is larger than the cathode anode signal difference.

15 Claims, 4 Drawing Sheets

DISPLAY DEVICE

CROSS-REFERENCE TO RELATED APPLICATION

This application claims priority to Taiwan Application Ser. No. 110129655, filed Aug. 11, 2021, which is herein incorporated by reference in its entirety.

BACKGROUND

Field of Invention

The present invention relates to a display device. More particularly, the present invention relates to a display device including a glass substrate and a plurality of light emitting diodes.

Description of Related Art

For most display devices on the market, driving circuit is arranged at one side of the substrate. In such design, transmission paths that are closer to the driving circuit have less resistance, and transmission paths that are farther from the driving circuit have higher resistance. The currents passing through different light emitting diodes (LEDs) will be different because of resistance difference, and the display's brightness will not be uniform.

SUMMARY

The present disclosure provides a display device, including a glass substrate and a plurality of light emitting diodes. The glass substrate includes a first side and a second side. The first side and the second side are two opposite sides of the glass substrate. The plurality of light emitting diodes are arranged on the glass substrate and as a row extending from the first side to the second side. The plurality of light emitting diodes include a first light emitting diode adjacent to the first side and a second light emitting diode adjacent to the second side. A first anode signal received by the first light emitting diode has a first anode signal difference compared to a reference anode signal. A second anode signal received by the second light emitting diode has a second anode signal difference compared to the reference anode signal. The first anode signal difference is smaller than the second anode signal difference. A first cathode signal received by the first light emitting diode has a first cathode signal difference compared to a reference cathode signal. A second cathode signal received by the second light emitting diode has a second cathode signal difference compared to the reference cathode signal. The first cathode signal difference is greater than the second cathode signal difference.

The present disclosure also provides a display device, including a glass substrate and a plurality of light emitting diodes. The glass substrate includes a first side and a second side. The first side and the second side are two opposite sides of the glass substrate. The plurality of light emitting diodes are arranged on the glass substrate and as a row extending from the first side to the second side. Each of the plurality of light emitting diodes receives a first anode signal, a second anode signal, a first cathode signal, and a second cathode signal. The first anode signal has a first anode signal difference compared to a first reference anode signal, the second anode signal has a second anode signal difference compared to a second reference anode signal, the first cathode signal has a first cathode signal difference compared to a first reference cathode signal, and the second cathode signal has a second cathode signal difference compared to a second reference cathode signal. The plurality of the light emitting diodes that are closer to the second side have greater first anode signal difference and first cathode signal difference, and the plurality of the light emitting diodes that are closer to the first side have greater second anode signal difference and second cathode signal difference.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
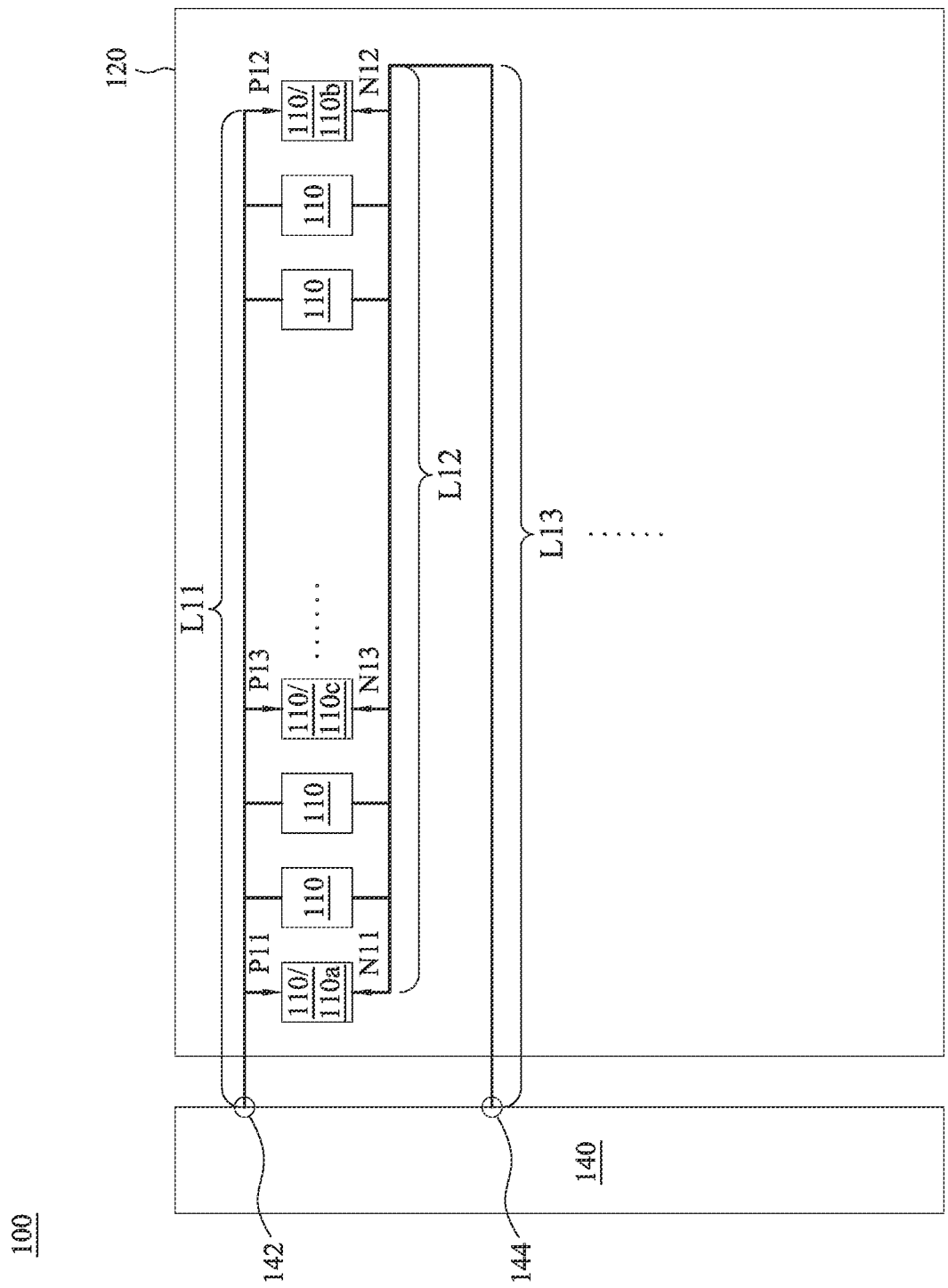
FIG. 1 is a circuit diagram of a display device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

The terms used in this specification generally have their ordinary meanings in the art, within the context of the invention, and in the specific context where each term is used.

As used in the present disclosure, the terms "comprising," "including," "having," "containing," "involving," and the like are to be understood to be open-ended, i.e., to mean including but not limiting to. In addition, as used in the present disclosure, the term "and/or" includes any and all combinations of one or more of the associated listed items.

It will be understood that when an element is referred to as being "connected to," "coupled to," or "electrically connected to" another element, it can be directly connected or coupled to the other element or intervening elements may be present. In contrast, when an element is referred to as being "directly connected to," "directly coupled to," or "directly electrically connected to" another element, there is no intervening element present. In addition, when an element is referred to as being "communicatively connected to" another element, it can be indirectly or directly connected to the other element through wire or wireless communication. Moreover, it will be understood that, although the terms "first," "second," etc., may be used herein to describe various elements, these elements should not be limited by these terms. These terms are used to distinguish one element from another.

One embodiment of the present disclosure discloses a display device. Please refer to FIG. 1. FIG. 1 is a circuit diagram of a display device 100 according to one embodiment of the present disclosure. The display device 100 includes a glass substrate 120 and a plurality of light emitting diodes (LEDs) 110. The plurality of LEDs 110 are arranged as a row on the glass substrate 120. In the embodiment shown in FIG. 1, the row of the LEDs 110 extends from one side of the glass substrate 120 to the other side of the glass substrate 120 along the horizontal direction. For example, the LEDs 110 are sequentially arranged from the left side of the glass substrate 120 to the right side of the glass substrate 120. The direction of the row of LEDs 110 in FIG. 1 is merely exemplary and does not intend to limit the present disclosure. In other words, multiple LEDs 110 are arranged as various horizontal rows on the glass substrate 120, and each row is perpendicular to the first side (e.g., the left side of the glass substrate 120) and the second side (e.g., the right side of the glass substrate 120) of the glass substrate 120. In one embodiments, one row includes forty-eight LEDs. It should be noted that the number of LEDs 110 included in a row does not intend to limit the present disclosure, and such number can be adjusted according to actual needs. In one embodiment, each of the LED 110 includes an anode configured to receive an anode signal and a cathode configured to receive a cathode signal.

As shown in FIG. 1, the plurality of LEDs 110 include a first LED 110a adjacent to the left side and a second LED 110b adjacent to the right side. In the row of LEDs 110 shown in FIG. 1, the leftmost LED 110 (i.e., the one closest to the first side of the glass substrate 120) is the first LED 110a, and the rightmost LED 110 (i.e., the one closest to the second side of the glass substrate 120) is the second LED 110b. Between the first LED 110a and the second LED 110b there still exist multiple LEDs 110.

In one embodiment, the display device 100 includes a driving circuit 140 configured to provide power to drive the LEDs 110 on the glass substrate 120. The driving circuit 140 includes a plurality of anode signal ends 142 configured to transmit anode signals to the LEDs 110 and a plurality of cathode signal ends 144 configured to transmit cathode signals to the LEDs 110. In this embodiment, as shown in FIG. 1, the driving circuit 140 is adjacent to the left side of the glass substrate 120, the anode signal end 142 is coupled to the LEDs 110, and the cathode signal end 144 is coupled to the LEDs 110. For the purpose of clarity, only a pair of anode signal end 142 and cathode signal end 144 that corresponds to one row of the LEDs 110 is shown in FIG. 1. In one embodiment, the driving circuit 140 includes multiple pairs of anode signal ends 142 and cathode signal ends 144, and each pair correspond to a row of the LEDs 110 on the glass substrate 120.

In one embodiment, the driving circuit 140 is coupled to the LEDs 110 on the glass substrate 120 through multiple lines. In this embodiment, the display device 100 further includes a first line L11, a second line L12, and a third line L13. The first line L11 is coupled between the driving circuit 140 and the LEDs 110. Specifically, the first line L11 couples the anode signal end 142 to the anodes of the LEDs 110 and is configured to transmit the anode signals generated by the driving circuit 140 to the LEDs 110. The second line L12 couples the LEDs 110 and connects the cathodes of the LEDs 110 together. The third line L13 is coupled between the second line L12 and the driving circuit 140. The third line L13 extends from the left side of the glass substrate 120 to the right side and connects to the second line L12 at a position adjacent to the right side. Specifically, the third line L13 extends from the cathode signal end 144 of the driving circuit 140 to the right side and couples to the second line L12 in order to transmit the cathode signals generated by the driving circuit 140 to the second line L12. Then, the second line L12 passes the cathode signals to the LEDs 110.

As shown in FIG. 1, the anode signal end 142 of the driving circuit 140 transmits a first anode signal P11 to the first LED 110a and transmits a second anode signal P12 to the second LED 110b, and the cathode signal end 144 of the driving circuit 140 transmits a first cathode signal N11 to the first LED 110a and transmits a second cathode signal N12 to the second LED 110b.

In one embodiment, the first line L11 is configured to transmit the first anode signal P11 to the first LED 110a through a first transmission distance and transmit the second anode signal P12 to the second LED 110b through a second transmission distance, and the second line L12 and the third line L13 are configured to transmit the first cathode signal N11 to the first LED 110a through a third transmission distance and transmit the second cathode signal N12 to the second LED 110b through a fourth transmission distance. Specifically, the driving circuit 140 transmits the anode signals to the LEDs 110 through the anode signal end 142, and because the anode signals are transmitted through the first line L11 that has resistance, the anode signals received by the LEDs 110 are different. The distance along the first line L11 from the anode signal end 142 to the first LED 110a is the first transmission distance, and the anode signal passing through the first transmission distance and received by the first LED 110a is the first anode signal P11; the distance along the first line L11 from the anode signal end 142 to the second LED 110b is the second transmission distance, and the anode signal passing through the second transmission distance and received by the second LED 110b is the second anode signal P12.

On the other hand, the driving circuit 140 transmits the cathode signals to the LEDs 110 through the cathode signal end 144. Similarly, because the cathode signals are transmitted through the second line L12 and the third line L13 that have resistance, the cathode signals received by the LEDs 110 are different. The driving circuit 140 transmits the cathode signals from the cathode signal end 144 to the LEDs 110 through the third line L13 and the second line L12. The distance along the second line L12 and the third line L13 from the cathode signal end 144 to the cathode of the first LED 110a is the third transmission distance, and the cathode signal passing through the third transmission distance and received by the first LED 110a is the first cathode signal N1. The distance along the second line L12 and the third line L13 from the cathode signal end 144 to the cathode of the second LED 110b is the fourth transmission distance, and the cathode signal passing through the fourth transmission distance and received by the second LED 110b is the second cathode signal N12.

The first anode signal P11 received by the first LED 110a has a first anode signal difference compared to a reference anode signal, and the second anode signal P12 received by the second LED 110B has a second anode signal difference compared to the reference anode signal. The reference anode signal is an anode signal generated by the driving circuit 140. The difference between the reference anode signal and the first anode signal P11 is the first anode signal difference, and the difference between the reference anode signal and the second anode signal P12 is the second anode signal difference. Because the first LED110a is closer to the driving circuit 140 than the second LED110b is, the first anode signal difference is smaller than the second anode signal difference. Specifically, both the first anode signal difference and the second anode signal difference are caused as the anode signals are transmitted through the first line L11, and longer transmission distance causes larger signal difference. As shown in FIG. 1, the second transmission distance (the distance along the first line L11 from the anode signal end 142 to the second LED 110b) is greater than the first transmission distance (the distance along the first line L11 from the anode signal end 142 to the first LED 110a), so the second anode signal difference associated with the second LED 110b will be greater than the first anode signal difference associated with the first LED 110a.

Similarly, the first cathode signal N11 received by the first LED 110a has a first cathode signal difference compared to a reference cathode signal, and the second cathode signal N12 received by the second LED 110b has a second cathode signal difference compared to the reference cathode signal. The reference cathode signal is a cathode signal generated by the driving circuit 140. The difference between the reference cathode signal and the first cathode signal N11 is the first cathode signal difference, and the difference between the reference cathode signal and the second cathode signal N12 is the second cathode signal difference. Due to the routing of the second line L12 and the third line L13, the first cathode signal difference is greater than the second cathode signal difference, although the first LED 110a is closer to the driving circuit 140 than the second LED 110b is. Specifically, both the first cathode signal difference and the second cathode signal difference are caused as the cathode signals are transmitted through the second line L12 and the third line L13. As shown in FIG. 1, the third transmission distance (the distance along the third line L13 from the cathode signal end 144 to a position adjacent to the right side, plus the distance along the second line L12 from the position to the first LED 110a) is greater than the fourth transmission distance (the distance along the third line L13 from the cathode signal end 144 to the position adjacent to the right side, plus the distance along the second line L12 from the position and to second LED 110b), so the first cathode signal difference associated with the first LED 110a will be greater than the second cathode signal difference associated with the second LED 110b.

In one embodiment, a first transmission resistance formed by the first transmission distance along the first line L11 and the third transmission distance along the third line L13 and the second line L12 is equal to a second transmission resistance formed by the second transmission distance of the first line L11 and the fourth transmission distance of the third line L13 and the second line L12. When the resistance per unit length of the first line L11, the second line L12, and the third line L13 are the same (e.g., when the width, material, and conductivity of the first line L11, the second line L12, and the third line L13 are the same), the sum of the first transmission distance and the third transmission distance will be equal to the sum of the second transmission distance and the fourth transmission distance. The driving circuit 140, by providing a voltage difference between the anode signal end 142 and the cathode signal end 144, generates current to drive the first LED 110a and the second LED 110b. The current passing through the first LED 110a depends on the voltage provided by the driving circuit 140 and the resistance of transmission path (i.e., the first transmission distance plus the third transmission distance), and the current passing through the second LED 110b depends on the voltage provided by the driving circuit 140 and the resistance of transmission path (i.e., the second transmission distance plus the fourth transmission distance). When the first line L11, the second line L12, and the third line L13 have the same resistance per unit length, because the sum of the first transmission distance and the third transmission distance is equal to the sum of the second transmission distance and the fourth transmission distance, the current passing through the first LED 110a is substantially equal to the current passing through the second LED 110b. In other words, the brightness of the first LED 110a and the brightness of the second LED 110b is substantially similar.

Above describe the signal transmissions and signal difference associated with the first LED 110a and the second LED 110b, and in one embodiment, there exist multiple LEDs 110 between the first LED 110a and the second LED 110b. In such embodiment, as shown in FIG. 1, the LEDs 110 include a third LED 110c, arranged between the first LED 110a and the second LED 110b. A third anode signal received by the third LED 110c has a third anode signal difference compared to the reference anode signal, and a third cathode signal received by the third LED 110c has a third cathode signal difference compared to the reference cathode signal. The third anode signal difference is greater than the first anode signal difference and smaller than the second anode signal difference, and the third cathode signal difference is smaller than the first cathode signal difference and greater than the second cathode signal difference. Specifically, the third anode signal difference and the third cathode signal difference also depend on the voltage provided by the driving circuit 140 and the transmission distance. Because the third LED 110c is located between the first LED 110a and the second LED 110b, the transmission distance through which the driving circuit 140 transmits the anode signal to the third LED 110c is greater than the first transmission distance and smaller than the second transmission distance, and the third anode signal difference is greater than the first anode signal difference and smaller than the second anode signal difference. Similarly, the transmission distance through which the driving circuit 140 transmits the cathode signal to the third LED 110c is smaller than the third transmission distance and greater than the fourth transmission distance, so the third cathode signal difference is smaller than the first cathode signal difference and greater than the second cathode signal difference.

According to the relationship among the first anode signal difference, the third anode signal difference, and the second anode signal difference described above, it is observed that the LEDs 110 that are closer to the right side of the glass substrate 120 have greater anode signal difference. The difference between the anode signal received by the LED 110 and the reference anode signal can be understood as distortion of the anode signal, and a distortion direction of the anode signal can then be defined to be left to right. Similarly, according to the relationship among the first cathode signal difference, the third cathode signal difference, and the second cathode signal difference described above, it is observed that the LEDs 110 that are closer to the left side of the glass substrate 120 have greater cathode signal difference. The difference between the cathode signal received by the LED 110 and the reference cathode signal can be understood as distortion of the cathode signal, and a distortion direction of the cathode signal can then be defined to be right to left. In the embodiment shown in FIG. 1, the distortion direction of the cathode signal is opposite to the distortion direction of the anode signal.

In conclusion, the display device 100 uses unique routing design so that the distortion directions of the anode signal and the cathode signal are opposite to each other, and thus the brightness uniformity among the LEDs 110 arranged on the glass substrate 120 can be enhanced.

Figure 2:
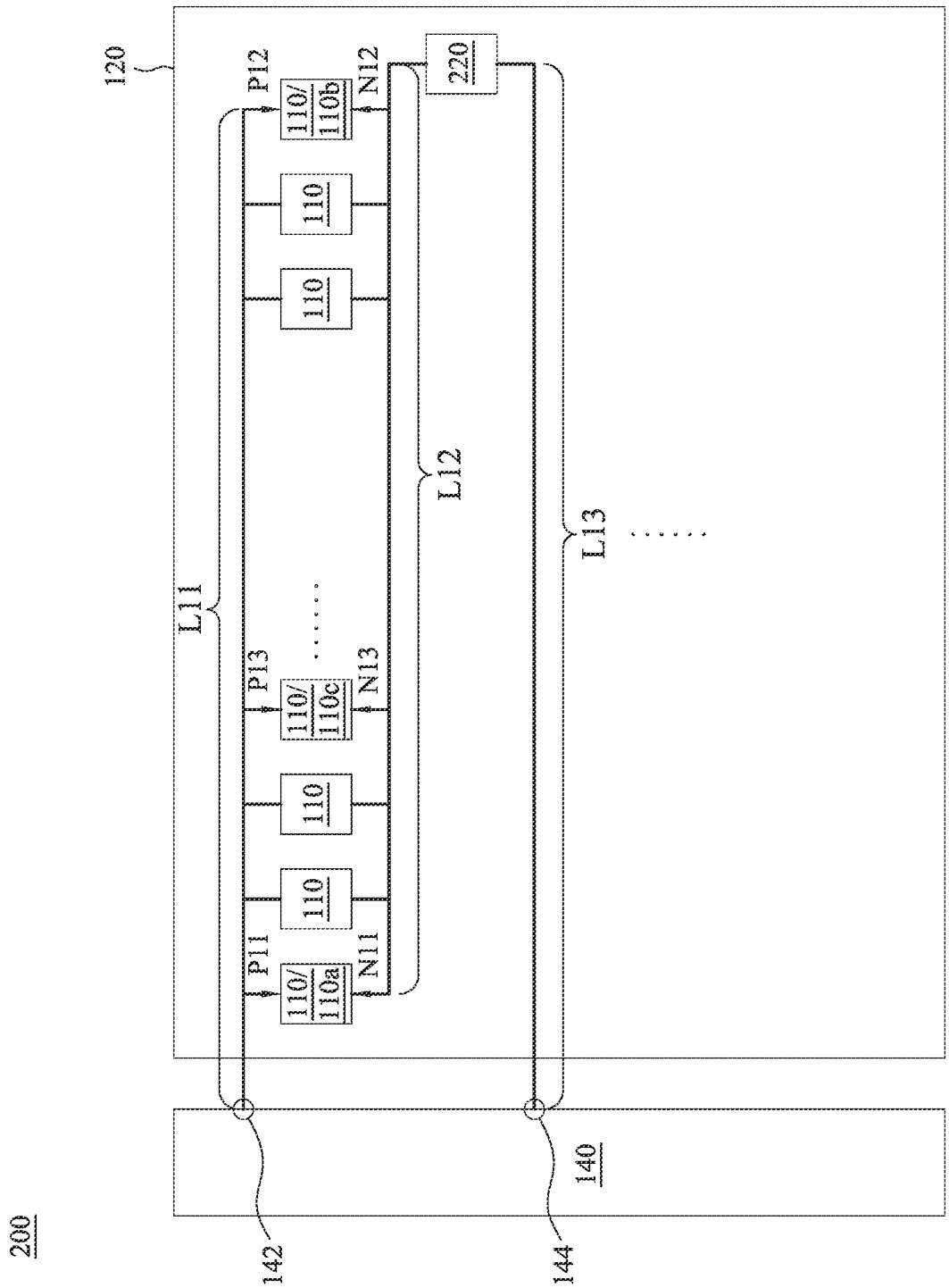
FIG. 2 is a circuit diagram of a display device according to one embodiment of the present disclosure.

In some embodiments of the present disclosure, the display device further includes a level shifting circuit. Please refer to FIG. 2. FIG. 2 is a circuit diagram of a display device 200 according to one embodiment of the present disclosure. The display device 200 includes, other than the components of the display device 100 shown in FIG. 1, a level shifting circuit 220. The level shifting circuit 220 is coupled between the second line L12 and the third line L13 at a position adjacent to the right side of the glass substrate 120. The level shifting circuit 220 is configured to adjust the level of the first cathode signal N11 and the second cathode signal N12. Specifically, the driving circuit 140 provides direct current (DC) power through the third line L13 to drive the level shifting circuit 220, and the level shifting circuit 220 performs level shifting and outputs a voltage higher than the voltage that it receives. For example, if the level shifting circuit 220 receives a voltage of 5 V, it outputs a voltage of 10 V or 20 V. In one embodiment, the level shifting circuit 220 includes an input terminal and an output terminal, the input terminal is configured to receive the cathode signals from the driving circuit 140, and the output terminal is configured to the level shifted cathode signals to the LEDs 110. In one embodiment, the level shifting circuit 220 is bonded onto the glass substrate 120 through Chip On Glass (COG) process.

Figure 3:
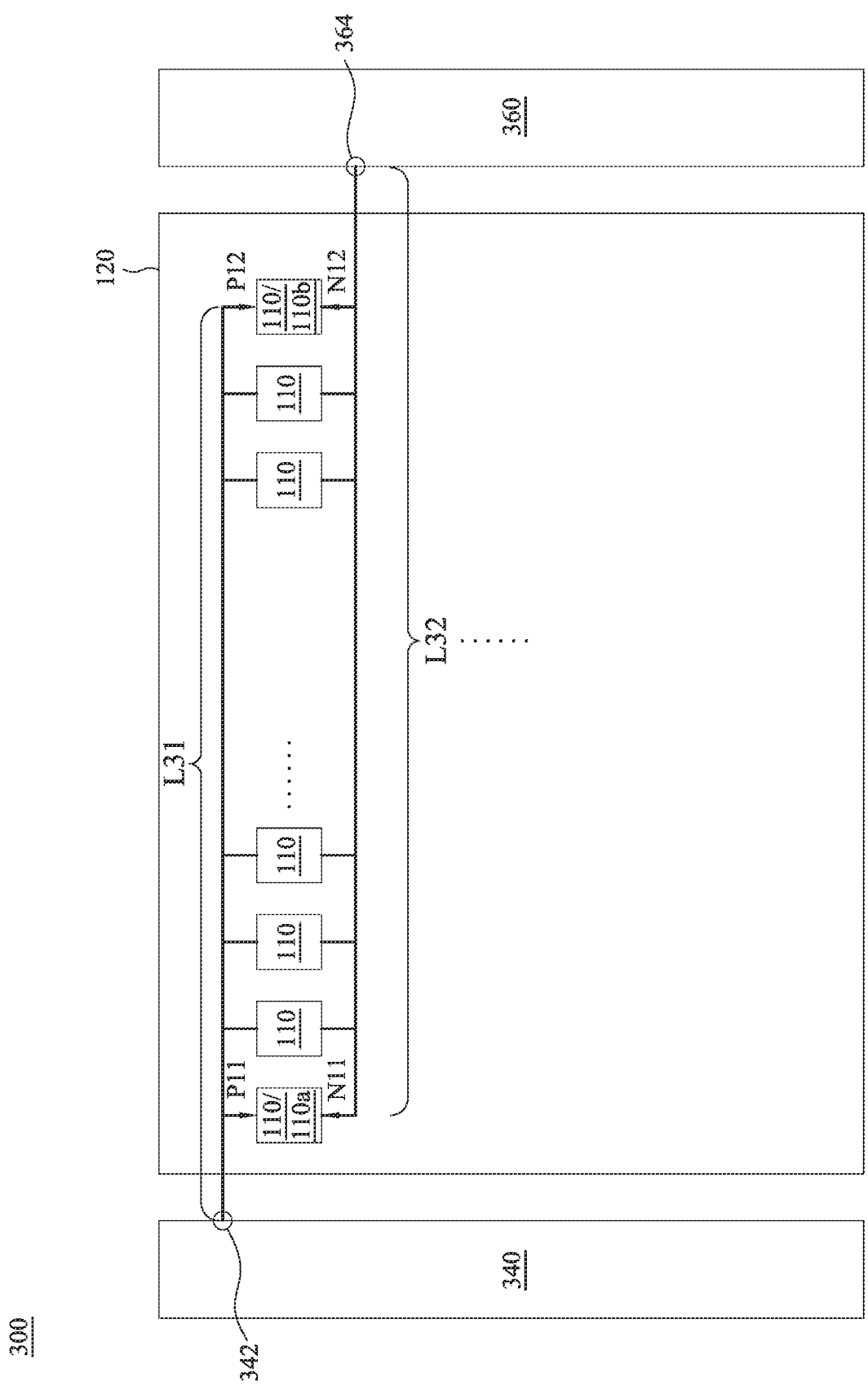
FIG. 3 is a circuit diagram of a display device according to one embodiment of the present disclosure.

In some embodiments of the present disclosure, the display device includes two driving circuits. Please refer to FIG. 3. FIG. 3 is a circuit diagram of a display device 300 according to one embodiment of the present disclosure. The display device 300 includes a first driving circuit 340 and a second driving 360. The first driving circuit 340 is adjacent to the left side of the glass substrate 120, and a plurality of anode signal ends 342 of the first driving circuit 340 are coupled to the plurality of LEDS 110 and configured to transmit the first anode signal P11 and the second anode signal P12. The second driving circuit 360 is adjacent to the right side of the glass substrate 120, and a plurality of cathode signal ends 364 of the second driving circuit 360 are coupled to the plurality of LEDS 110 and configured to transmit the first cathode signal N11 and the second cathode signal N12. For the purpose of clarity, only a pair of the anode signal end 342 and the cathode signal end 364 is shown in FIG. 3, and such pair corresponds to one row of the LEDs 110. In one embodiment, the driving circuit 140 includes multiple pairs of anode signal ends 342 and cathode signal ends 364, and each pair corresponds to one row of the LEDs 110.

In one embodiment, the display device 300 includes a first line L31 and the second line L32. The first line L31 is coupled between the first driving circuit 340 and the plurality of LEDs 110 and configured to transmit the first anode signal P11 to the first LED 110a through the first transmission distance and to transmit the second anode signal P12 to the second LED 110b through the second transmission distance. The second line L32 is coupled between the second driving circuit 360 and the plurality of LEDs 110 and configured to transmit the first cathode signal N11 to the first LED 110a through a fifth transmission distance and to transmit the second cathode signal N12 to the second LED 110b through a sixth transmission distance.

Specifically, the first driving circuit 340 transmits anode signals through the anode signal end 342, and transmits anode signals to the anodes of the LEDs 110 through the first line L31 (including transmitting the first anode signal P11 to the first LED 110a and transmitting the second anode signal P12 to the second LED 110b). On the other hand, the second driving circuit 360 transmits cathode signals through the cathode signal end 364, and transmits cathode signals to the cathodes of the LEDs 110 through the second line L32 (including transmitting the first cathode signal N11 to the first LED 110a and transmitting the second cathode signal N12 to the second LED 110b).

In this embodiment, the LEDs 110 that are closer to the right side have longer transmission distance from the first driving circuit 340 and thus have greater anode signal difference (i.e., the distortion direction of anode signal is left to right), and the LEDs 110 that are closer to the left side have longer transmission distance from the second driving circuit 360 and thus have greater cathode signal difference (i.e., the distortion direction of cathode signal is right to left).

In one embodiment, the transmission resistance formed by the first transmission distance along the first line L31 and the fifth transmission distance along the second line L32 is equal to the transmission resistance formed by the second transmission distance along the first line L31 and the sixth transmission distance along the second line L32. If the resistance per unit length of the first line L31 and the second line L32 are the same (e.g., when the width, material, and conductivity of the first line L31 and the second line L32 are the same), the sum of the first transmission distance and the fifth transmission distance will be equal to the sum of the second transmission distance and the sixth transmission distance. In other words, when the first line L31 and the second line L32 have the same resistance per unit length, the current passing through the first LED 110a and the current passing through the second LED 110b have to go through transmission distances that are substantially the same, and thus the brightness uniformity among LEDs 110 on the glass substrate 120 is enhanced.

Figure 4:
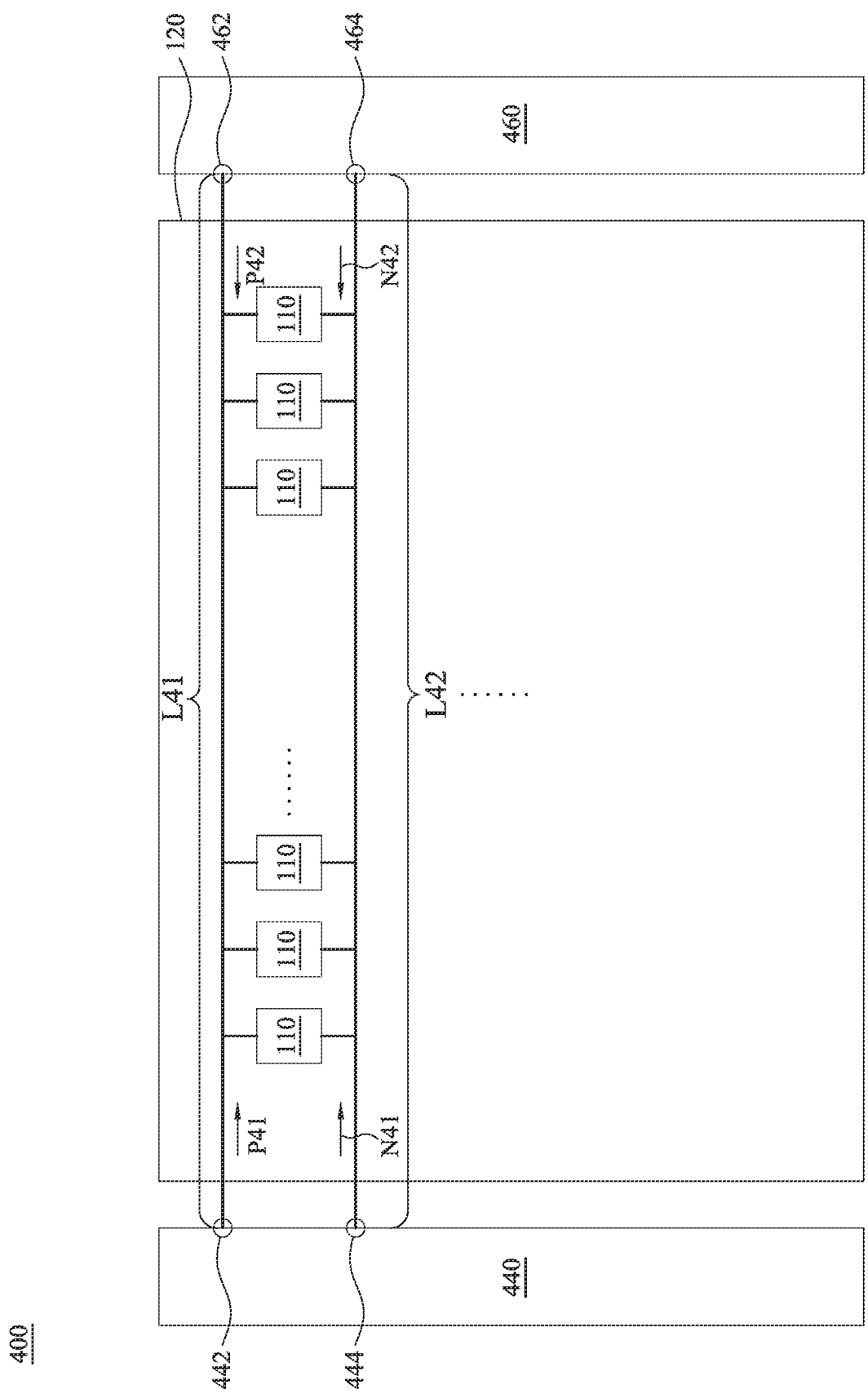
FIG. 4 is a circuit diagram of a display device according to one embodiment of the present disclosure.

Some embodiments of the present disclosure disclose yet another display device. Please refer to FIG. 4. FIG. 4 is a circuit diagram of a display device 400 according to one embodiment of the present disclosure. The display device 400 includes the glass substrate 120 and the plurality of LEDs 110. The plurality of LEDs 110 are arranged as a row on the glass substrate 120. In the embodiment shown in FIG. 4, the row of the LEDs 110 extends from one side of the glass substrate 120 to the other side of the glass substrate 120 along the horizontal direction. For example, multiple LEDs 110 are sequentially arranged from the left side of the glass substrate 120 to the right side of the glass substrate 120. The direction of the row of LEDs 110 in FIG. 4 is merely exemplary and does not intend to limit the present disclosure. In other words, multiple LEDs 110 are arranged as various horizontal rows on the glass substrate 120, and each row is perpendicular to the first side of the glass substrate 120 (e.g., the left side of the glass substrate 120) and the second side of the glass substrate 120 (e.g., the right side of the glass substrate 120).

In one embodiment, the display device 400 includes a first driving circuit 440 and a second driving circuit 460. As shown in FIG. 4, the first driving circuit 440 is adjacent to the left side of the glass substrate 120, and a plurality of anode signal ends 442 of the first driving circuit 440 are coupled to the plurality of LEDs 110 and configured to transmit the first anode signal P41. A plurality of cathode signal ends 444 of the first driving circuit 440 are coupled to the plurality of LEDs 110 and configured to transmit the first cathode signal N41. The second driving circuit 460 is adjacent to the right side of the glass substrate 120, and a plurality of anode signal ends 462 of the second driving circuit 460 are coupled to the plurality of LEDs 110 and configured to transmit the second anode signal P42. A plurality of cathode signal ends 464 of the second driving circuit 460 are coupled to the plurality of LEDs 110 and configured to transmit the second cathode signal N42.

In one embodiment, the display device 400 includes a first line L41 and a second line L42. As shown in FIG. 4, the first line L41 is coupled to the first driving circuit 440, the plurality of LEDs 110, and the second driving circuit 460. The first line L41 is configured to connect the anodes of the LEDs 110 together, transmit the first anode signal P41 to each LED 110 from the anode signal end 442, and transmit the second anode signal P42 to each LED 110 from the anode signal end 462. The second line L42 is coupled to the first driving circuit 440, the plurality of LEDs 110, and the second driving circuit 460. The second line L42 is configured to connect the cathodes of the LEDs 110 together, transmit the first cathode signal N41 to each LED 110 from the cathode signal end 444, and transmit the second cathode signal N42 to each LED 110 from the cathode signal end 464.

Specifically, the first driving circuit 440 transmits the first anode signal P41 to the first line L41 through the anode signal end 442, and each LED 110 receives the first anode signal P41 through the first line L41. Similarly, the second driving circuit 460 transmits the second anode signal P42 through the anode signal end 462, and each LED 110 receives the second anode signal P42 through the first line L41. The first driving circuit 440 transmits the first cathode signal N41 to the second line L42 through the cathode signal end 444, and each LED 110 receives the first cathode signal N41 through the second line L42. Similarly, the second driving circuit 460 transmits the second cathode signal N42 through the cathode signal end 464, and each LED 110 receives the second cathode signal N42 through the second line L42.

The first anode signal P41 has a first anode signal difference compared to a first reference anode signal. The first reference signal is the anode signal generated by the first driving circuit 440. Because the line used for transmitting signals has resistance, there exists difference between the first anode signal P41 and the first reference anode signal (i.e., the first anode signal difference). Similarly, the second anode signal P42 has a second anode signal difference compared to the reference anode signal generated by the second driving circuit 460, the first cathode signal N41 has a first cathode signal difference compared to the reference cathode signal generated by the first driving circuit 440, the second cathode signal N42 has a second cathode signal difference compared to the reference cathode signal generated by the second driving circuit 460.

It is worth noted that, because the LEDs 110 receive anode signals and cathode signals through different transmission paths, the first anode signals P41, the second anode signals P42, the first cathode signals N41, and the second cathode signals N42 received by them will be different. The LEDs 110 that are closer to the right side have greater first anode signal difference and greater first cathode signal difference, and the LEDs 110 that are closer to the left side have greater second anode signal difference and greater second cathode signal difference. Specifically, because the first anode signal P41 and the first cathode signal N41 are transmitted from the first driving circuit 440 that is adjacent to the left side, the first anode signal P41 and the first cathode signal N41 received by the LEDs 110 that are farther from the first driving circuit 440 will have greater difference from the reference signal. In contrast, because the second anode signal P42 and the second cathode signal N42 are transmitted from the second driving circuit 460 that is adjacent to the right side, the second anode signal P42 and the second cathode signal N42 received by the LEDs 110 that are farther from the second driving circuit 460 will have greater difference from the reference signal. When signal difference is understood as distortion of signal, the distortion directions of the first anode signal P41 and the first cathode signal N41 are both left to right, and the distortion directions of the second anode signal P42 and the second cathode signal N42 are both right to left. That is, the first anode signal P41 and the second anode signal P42 have the opposite distortion directions, and the first cathode signal N41 and the second cathode signal N42 have the opposite distortion directions.

In conclusion, the display device provides two pairs of anode signals and cathodes signals by two driving circuits so that the anode signals and the cathode signals have the opposite distortion directions, and thus the LEDs 110 on the glass substrate can have uniform brightness.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device comprising:
a glass substrate, comprising a first side and a second side, the first side and the second side being two opposite sides of the glass substrate;
a plurality of light emitting diodes, arranged on the glass substrate and as a row extending from the first side to the second side, the plurality of light emitting diodes comprising a first light emitting diode adjacent to the first side and a second light emitting diode adjacent to the second side; and
a driving circuit coupled to the plurality of light emitting diodes, and configured to generate a reference anode signal and a reference cathode signal;
wherein an anode of the first light emitting diode receives a first anode signal from the driving circuit, the first anode signal is different from the reference anode signal by a first signal difference, an anode of the second light emitting diode receives a second anode signal from the driving circuit, the second anode signal is different from the reference anode signal by a second signal difference, and the first signal difference is smaller than the second signal difference; and
wherein a cathode of the first light emitting diode receives a first cathode signal from the driving circuit, the first cathode signal is different from the reference cathode signal by a third signal difference, a cathode of the second light emitting diode receives a second cathode signal from the driving circuit, the second cathode signal is different from the reference cathode signal by a fourth signal difference, and the third signal difference is greater than the fourth signal difference.

2. The display device of claim 1, wherein the plurality of light emitting diodes comprises a third light emitting diode arranged between the first light emitting diode and the second light emitting diode, an anode of the third light emitting diode receives a third anode signal from the driving circuit, the third anode signal is different from the reference anode signal by a fifth signal difference, a cathode of the third light emitting diode receives a third cathode signal from the driving circuit, the third cathode signal is different from the reference cathode signal by a sixth signal difference, the fifth signal difference is greater than the first signal difference and smaller than the second signal difference, and the sixth signal difference is smaller than the third signal difference and greater than the fourth signal difference.

3. The display device of claim 1, wherein the driving circuit is adjacent to the first side of the glass substrate and comprises a plurality of anode signal ends and a plurality of cathode signal ends, wherein the plurality of anode signal ends are coupled to the plurality of light emitting diodes and configured to transmit the first anode signal and the second anode signal, and the plurality of cathode signal ends are coupled to the plurality of light emitting diodes and configured to transmit the first cathode signal and the second cathode signal.

4. The display device of claim 1, wherein the reference anode signal is generated from a first end of the driving circuit, the reference cathode signal is generated from a second end of the driving circuit, and the second end is different from the first end.

5. The display device of claim 3, further comprising:
a first line, coupled between the driving circuit and the plurality of light emitting diodes, and configured to transmit the first anode signal to the first light emitting diode through a first transmission distance and to transmit the second anode signal to the second light emitting diode through a second transmission distance;
a second line, coupled to the plurality of light emitting diodes; and
a third line, coupled between the second line and the driving circuit and extending from the first side to the second side, the third line being coupled to the second line at a position adjacent to the second side, the second line and the third line being configured to transmit the first cathode signal to the first light emitting diode through a third transmission distance and to transmit the second cathode signal to the second light emitting diode through a fourth transmission distance.

6. The display device of claim 5, wherein a first transmission resistance formed by the first transmission distance of the first line and the third transmission distance of the third line and the second line is equal to a second transmission resistance formed by the second transmission distance of the first line and the fourth transmission distance of the third line and the second line.

7. The display device of claim 6, wherein a first current passing through the first light emitting diode is substantially equal to a second current passing through the second light emitting diode.

8. The display device of claim 5, wherein the resistance per unit length of the first line, the second line, and the third line are the same, and the sum of the first transmission distance and the third transmission distance is equal to the sum of the second transmission distance and the fourth transmission distance.

9. The display device of claim 5, further comprising:
a level shifting circuit, coupled between the second line and the third line at a position adjacent to the second side, and configured to adjust levels of the first cathode signal and the second cathode signal.

10. The display device of claim 9, wherein the level shifting circuit is bonded onto the glass substrate.

11. The display device of claim 1, further comprising:
a first driving circuit, adjacent to the first side of the glass substrate, a plurality of anode signal ends being coupled to the plurality of light emitting diodes and configured to transmit the first anode signal and the second anode signal; and
a second driving, adjacent to the second side of the glass substrate, a plurality of cathode signal ends being coupled to the plurality of light emitting diodes and configured to transmit the first cathode signal and the second cathode signal.

12. The display device of claim 11, further comprising:
a first line, coupled between the first driving circuit and the plurality of light emitting diodes, and configured to transmit the first anode signal to the first light emitting diode through a first transmission distance and to transmit the second anode signal to the second light emitting diode through a second transmission distance; and
a second line, coupled between the second driving circuit and the plurality of light emitting diodes, and configured to transmit the first cathode signal to the first light emitting diode through a fifth transmission distance and to transmit the second cathode signal to the second light emitting diode through a sixth transmission distance.

13. The display device of claim 12, wherein the transmission resistance formed by the first transmission distance along the first line and the fifth transmission distance along the second line is equal to the transmission resistance formed by the second transmission distance along the first line and the sixth transmission distance along the second line.

14. The display device of claim 13, wherein the current passing through the first light emitting diode is substantially equal to the current passing through the second light emitting diode.

15. The display device of claim 12, wherein the resistance per unit length of the first line and the second line are the same, and the sum of the first transmission distance and the fifth transmission distance is equal to the sum of the second transmission distance and the sixth transmission distance.

* * * * *